(12) United States Patent  (10) Patent No.: US 9,360,501 B2
Chi et al.  (45) Date of Patent: Jun. 7, 2016

(54) INTEGRATED ELECTRIC FIELD SENSOR

(75) Inventors: Yu Mike Chi, La Jolla, CA (US); Gert Cauwenberghs, San Diego, CA (US); Christoph Hans Maier, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 655 days.

(21) Appl. No.: 13/701,468

(22) PCT Filed: Jun. 1, 2011

(86) PCT No.: PCT/US2011/038727
§ 371 (c)(1),
(2), (4) Date: Jul. 29, 2013

(87) PCT Pub. No.: WO2011/153216
PCT Pub. Date: Dec. 8, 2011

(65) Prior Publication Data
US 2013/0300435 A1    Nov. 14, 2013
US 2014/0375338 A2    Dec. 25, 2014

Related U.S. Application Data

(60) Provisional application No. 61/350,449, filed on Jun. 1, 2010.

(51) Int. Cl.
*G01R 1/30* (2006.01)
*G01R 19/00* (2006.01)
*G01R 29/12* (2006.01)

(52) U.S. Cl.
CPC .............. *G01R 1/30* (2013.01); *G01R 19/0023* (2013.01); *G01R 29/12* (2013.01)

(58) Field of Classification Search
CPC ....... G01R 19/0023; G01R 1/30; G01R 29/12
See application file for complete search history.

(56) References Cited

U.S. PATENT DOCUMENTS 3,477,421 A    11/1969  Partridge
3,839,912 A *  10/1974  Schmoock ................ G01F 1/58
                                                    73/861.12

(Continued)

FOREIGN PATENT DOCUMENTS

EP    0636892 A2    2/1995
EP    0969477 A1    1/2000

(Continued)

OTHER PUBLICATIONS

International Search Report and Written Opinion for PCT/US2011/038727 dated Jan. 6, 2012, 9 pages.

(Continued)

*Primary Examiner* — Tung X Nguyen
*Assistant Examiner* — Alesa Allgood
(74) *Attorney, Agent, or Firm* — Eleanor Musick; Musick Davison LLP

(57) ABSTRACT

An electric field sensor includes one or more sensing electrodes connected to an integrated amplifier that bootstraps all parasitic capacitances at the sensor input to provide for a very high input impedance without the need for neutralization or other adjustments and calibration. The integrated amplifier for the electric field sensor further includes low-noise ESD/biasing structures to stabilize the DC-potential of the sensor with a minimum amount of added noise, leakage and parasitic capacitance.

34 Claims, 10 Drawing Sheets

(56) References Cited

U.S. PATENT DOCUMENTS

| | | | |
|---|---|---|---|
| 4,751,471 A | 6/1988 | Dunseath | |
| 6,392,558 B1 | 5/2002 | Schulmeyer et al. | |
| 6,704,180 B2 * | 3/2004 | Tyler | H01L 27/0255 361/56 |
| 8,054,061 B2 * | 11/2011 | Prance | G01R 33/323 324/658 |
| 2002/0139999 A1 * | 10/2002 | Hirano | G11C 16/16 257/200 |
| 2003/0105410 A1 | 6/2003 | Pearlman | |
| 2004/0152997 A1 | 8/2004 | Davies | |
| 2006/0085049 A1 | 4/2006 | Cory et al. | |
| 2007/0049845 A1 | 3/2007 | Fleischman et al. | |
| 2008/0079444 A1 * | 4/2008 | Denison | G01D 5/24 324/679 |
| 2009/0138059 A1 | 5/2009 | Ouwerkerk | |
| 2009/0309605 A1 | 12/2009 | Prance et al. | |
| 2011/0043225 A1 | 2/2011 | Sullivan et al. | |

FOREIGN PATENT DOCUMENTS

| | | |
|---|---|---|
| EP | 1487104 A2 | 12/2004 |
| JP | 06034688 A | 2/1994 |
| JP | 2009525479 A | 7/2009 |
| WO | 0213676 A2 | 2/2002 |
| WO | 2006007573 A1 | 1/2006 |
| WO | 2006061762 A2 | 6/2006 |
| WO | 2008135952 A1 | 11/2008 |
| WO | 2008009906 A1 | 1/2009 |

OTHER PUBLICATIONS

Chi, Yu M. & Cauwenberghs, G., "Wireless Non-contact EEG/ECG Electrodes for Body Sensor Networks", 2010 International Conference on Body Sensor Networks (BSN 2010), Jun. 2010, pp. 297-301.

Chi, Yu M. et al, "Dry-Contact and Noncontact Biopotential Electrodes: Methodological Review", IEEE Reviews in Biomedical Engineering, Oct. 11, 2010, vol. 3, pp. 106-119.

Chi, Yu M., et al., "Dry and Noncontact EEG Sensors for Mobile Brain-Computer Interfaces", IEEE Transactions on Neural Systems and Rehabilitation Engineering, Mar. 2012, vol. 20, pp. 228-235.

Chi, Yu M. et al., "Non-contact Low Power EEG/ECG Electrode for High Density Wearable Biopotential Sensor Networks", Sixth International Workshop on Wearable and Implantable Body Sensor Networks (BSN 2009), Jun. 2009, pp. 246-250.

Chi, Yu M. & Cauwenberghs, G., "Micropower Non-contact EEG Electrode with Active Common-Mode Noise Suppression and Input Capacitance Cancellation", 31st Annual International Conference of the IEEE Engineering in Medicine and Biology Society (EMBS 2009), Sep. 2009, pp. 4218-4221.

Chi, Yu M., et al., "Wireless Non-Contact Cardiac and Neural Monitoring", Wireless Health 2010, Oct. 2010, pp. 15-23.

Chi, Yu M. & Cauwenberghs, G., Micropower Integrated Bioamplifier and Auto-ranging ADC for Wireless and Implantable Medical Instrumentation, 2010 Proceedings of the IEEE Eur. Solid State Circuits Conf. (ESSCIRC), Sep. 2010, pp. 334-337.

* cited by examiner

INTEGRATED ELECTRIC FIELD SENSOR

RELATED APPLICATIONS

This application claims the benefit of U.S. Provisional Patent Application No. 61/350,449, filed Jun. 1, 2010, which is hereby incorporated by reference in its entirety.

FIELD OF THE INVENTION

The present invention relates to high input impedance sensors and circuits for measurements of electric fields.

BACKGROUND OF THE INVENTION

Non-contact, electric field measurements have been a challenge due to the need for constructing low-noise amplifiers with extremely high input impedance (>100 fF∥10 TΩ) and low noise (>0.1 $fA/Hz^{1/2}$). Prior art solid-state electric field sensors, such as those described in U.S. Pat. No. 6,686,800, US 2011/0043225, and U.S. Pat. No. 7,439,746, used for both free-space and biological applications, have relied on commercially available 'discrete' operational amplifiers or instrumentation amplifiers. One example is the TI INA116, from Texas Instruments, Dallas, Tex., which has an input impedance typically on the order of 2-5 pF∥1 TΩ and current noise levels of (0.1-0.5 $fA/Hz^{1/2}$).

For electric field sensors, it is typically desirable to maintain a high input impedance, which is dictated by the circuit elements that are connected to the sensor input. Any circuit element having a conductance or capacitance and connected to the sensor input necessarily degrades the input impedance. However, there are always circuit elements connected as part of the circuit's normal operation (e.g., an amplifying transistor, biasing resistor, and shield) and other parasitic byproducts (e.g., neighboring electrical connections to the input). Such circuit elements include at least one terminal connected to the sensor input and one or more terminals that are connected elsewhere. Prior art designs typically use an active shield, a well-known technique, to raise the sensor input impedance by driving the other terminals of the circuit elements such that the potential difference across any circuit element to the sensor input is zero. For purposes of the description herein, the terms "active shielding", "guarding" and "bootstrapping" are defined according to their common definitions as would be understood by one of skill in the art.

Although active shielding has been effective in the prior art for minimizing the input capacitance on the packaging and circuit board level, its efficacy is reduced for reducing the internal capacitance of a discrete amplifier. Commercial discrete amplifiers have, at the input, at least an electrostatic discharge (ESD) protection structure, packaging parasitic and device parasitic capacitance that are completely inaccessible and contribute at least 2-10 pF of input capacitance. Additionally, attempts at implementing a high impedance amplifier using discrete components (e.g., transistors, resistors, capacitors) with bootstrapping have become difficult, if not impossible, due to the lack of suitable discrete FET parts with appropriate specifications (e.g., low gate leakage for JFETs, and low leakage ESD for MO SFETs).

Overcoming the internal input capacitance within the discrete amplifier has required the use of a positive feedback network that comprises of a second amplifier, with gain greater than unity, driving a neutralization capacitor, a technique known to a person skilled in the art. Implementation is difficult due to the need for manual calibration and tuning. In addition, the use of neutralization is additionally imprecise due to the non-linear input capacitance (e.g., P-N junction capacitance of protection diodes) of a typical discrete amplifier, which may vary across operating conditions making the entire process inherently imprecise and difficult to manufacture. Finally, the neutralization amplifier often requires an additional power supply with a greater voltage range than that supplied to the sensor amplifier.

Other prior art has shown the possibility of bootstrapping a discrete amplifier's power supply to avoid the need for neutralization (U.S. Pat. No. 7,439,746). This method is effective but has an additional set of limitations, including that: 1) it requires a careful selection of components including the specific discrete amplifier part since this mode necessarily operates the part outside of its recommended usage; 2) a large voltage minimum supply range is necessary (>5-10V) since the supply must accommodate both the primary amplifier (3V) plus an additional overhead required to operate the power supply bootstrap circuit (~3-5V); and 3) stable operation is difficult to achieve due to the multiple feedback paths involved in bootstrapping of all the ports in a discrete amplifier.

Additionally, DC biasing the sensor input has been difficult due to the need for high resistance (>100 GΩ), low-noise (<0.1 $fA/Hz^{1/2}$), low-leakage (<20 fA), elements. Prior art has likewise used discrete circuit components, typically resistors or diodes, with or without bootstrapping, to supply the amplifier's input bias current and stabilize the DC potential of the sensor's input. The use of discrete components is subject to the following disadvantages: 1) low noise biasing resistors (<0.1 $fA/Hz^{1/2}$ current noise) are not commercially available and can be only implemented at great cost; 2) other input bias techniques, such as diodes, can provide lower noise but add additional leakage and capacitance to the input; and 3) discrete components add more parasitic capacitance and leakage than integrated versions of the same, adding noise to the sensor.

In view of the failure of the prior art to overcome the disadvantages described in the foregoing, the need remains for a sensor with ultra-high input impedance that is suitable for sensing of electric fields.

SUMMARY OF THE INVENTION

It is an object of the present invention to provide a sensor for detection of electric fields with an integrated amplifier having a high input impedance.

In an exemplary embodiment, high input impedance is achieved by directly bootstrapping the input transistor, and by maintaining an active shield and bootstrap from the physical sensor input to within the integrated amplifier itself. The inventive approach ensures that all circuit elements; both internal and external to the integrated amplifier are bootstrapped achieving a higher input impedance than what was possible with prior art designs. Additionally the present invention integrates and bootstraps the input biasing circuit to within the integrated amplifier and combines it with the ESD protection structure. The present invention also provides a method to remove the ESD/biasing structure entirely.

Integration of the input biasing on-chip according to the present invention make it possible to achieve higher impedance, lower noise, lower capacitance and additional bootstrapping. Alternatively, an integrated approach makes it possible to build a sensor that can operate without the need for conductive biasing and operate entirely as a floating gate. In such a mode, the sensor input is initialized by using a non-volatile charge write method (e.g. hot carrier injection, electron tunneling) to set the input transistor's gate voltage. Since there is no conductive path at the sensor input, input leakage, drift, and current noise can be eliminated.

In one aspect of the invention, an electric field sensor includes at least one sensing electrode for detecting an electric field and generating an input signal, a sensor input connected to the at least one sensing electrode for receiving the input signal, an integrated amplifier adapted to generate at least one buffered output signal that replicates the input signal, the integrated amplifier comprising a plurality of circuit elements, each circuit element comprising a plurality of terminals, an active shield connected to an output of the integrated amplifier so that the at least one buffered output signal drives the active shield. A least one terminal of each circuit element is connected to the sensor input and at least another terminal of each circuit element is connected to a signal that substantially follows the active shield so that the plurality of circuit elements connected to the sensor input are substantially bootstrapped. In one embodiment of the inventive sensor, at least one of the circuit elements comprises a field effect transistor having a gate, a drain, a source and a body terminal, wherein the gate is connected to the sensor input and the source and the body terminals are connected together. In an implementation of the present embodiment, a current between the source and the drain of the field effect transistor is maintained at a constant level so that a potential between the gate and the source and the body terminal is substantially constant, whereby the source and the body terminal are bootstrapped.

Additional embodiments of the present invention provide an electric field sensor that consists of only a single substrate by embedding multiple sensor plates on a single apparatus.

In another aspect of the invention, the sensor includes multiple electrodes arranged on a first surface of a sensor body, wherein the sensor input, integrated amplifier and active shield are encapsulated within a package disposed on a second surface of the sensor body, wherein the multiple electrodes comprise at least two pairs of active electrodes and a reference electrode. A differential amplifier connected to each pair of active electrodes generates an output comprising a potential difference across the connected pair of active electrodes. The potential difference across each pair of active electrodes is used to determine a local spatial electric field.

BRIEF DESCRIPTION OF THE DRAWINGS

The embodiments are illustrated by way of example and not by limitation in the Figures of the accompanying drawings, in which like references indicate like elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment, and such references mean at least one.

As used herein, "high impedance" means an impedance greater than 1 T$\Omega$∥5 pF.

Figure 1:
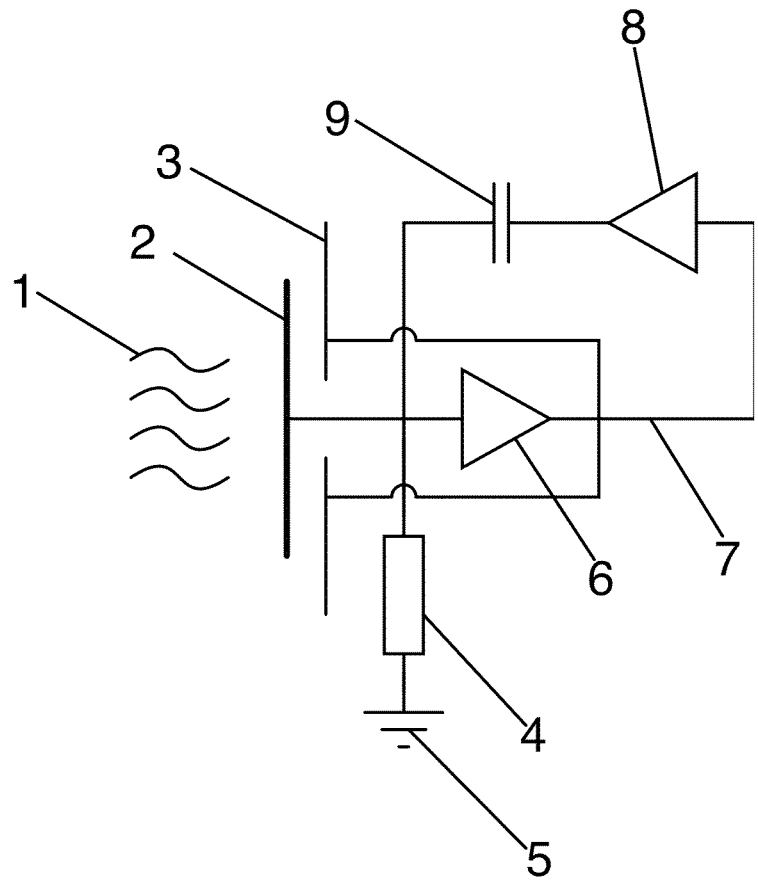
FIG. 1 is a diagram of an exemplary prior art electric field sensor design.

To facilitate understanding of the present invention, it is helpful to first refer to FIG. 1, which depicts an exemplary prior art electric field sensor design consisting of discrete components. Electric fields 1 are coupled into the sensor input electrode 2 which is typically a conductive plate. This sensor input 2 and connection to a discrete amplifier 6 is guarded by an external active shield 3 to reduce the effects of external interference and avoid extra capacitive loading. Since the sensor input 2 is capacitive in nature, a discrete biasing element external to the amplifier 4, typically a resistor or diode, is used to apply a DC reference potential 5 to the sensor input 2. The discrete amplifier of the prior art provides at least one buffered output 7 replicating the electrical potential at the sensor input 2 and is used to drive the active shield 3. As previously described, a limitation of the prior art is maintaining a high input impedance due to the inaccessibility of the internal nodes of the discrete amplifier 6. Any additional parasitic capacitances that cannot be bootstrapped by the active shield 3 must then be neutralized with a neutralization amplifier 8 which applies positive feedback to the input via a neutralization capacitor 9.

To avoid the need for neutralization, the present invention extends the guard to within the amplifier. The input capacitance of the integrated circuit amplifier arises primarily from the following sources: 1) the device capacitance of the amplifier, typically a transistor; 2) the wiring parasitic capacitance inside the integrated amplifier; 3) the parasitic capacitance from the chip bond-pad; and 4) the parasitic capacitance of the chip bond-wire and die package. The prior art effectively handles parasitic capacitances external to amplifier but not within. Thus, it is desirable to bootstrap the internal elements of the sensor's amplifier as taught by the present invention.

Figure 2:
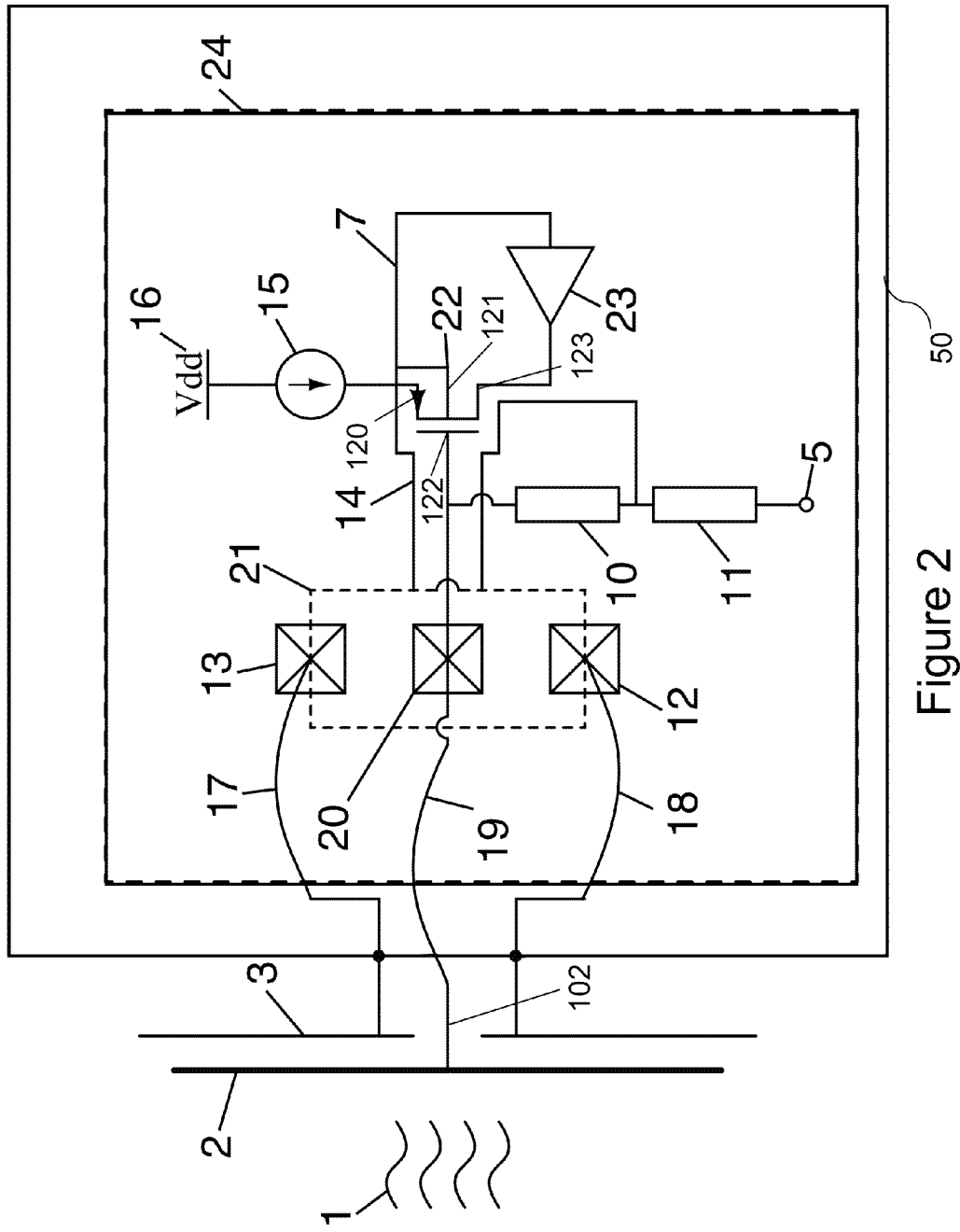
FIG. 2 is simple circuit diagram showing the basic elements of the present invention.

FIG. 2 is a diagram showing the basic elements of the inventive integrated amplifier, which bootstraps the sensor input. The circuit's elements are integrated on a semiconductor chip 24 using semiconductor fabrication techniques as are known in the art. As in the prior art, the present invention senses electric fields 1 via a sensing electrode 2, which is guarded by an active shield 3, which covers circuits external to the IC package such as those on the PCB and electrode. The sensor input 102 (the output of the sensing electrode) is electrically connected to the integrated amplifier by a chip bonding connection 19, which may be bond wires, bump bonds and/or any other method known in the art. In the present invention, this bonding connection is guarded with additional neighboring bonding connections 17, 18 connected to the active shield 3. The bonding connection is terminated with an input bond-pad 20 on the integrated amplifier. Additionally the active shield 3 is connected to the chip by way of bond-pads 12, 13. A chip bond-pad normally has a parasitic capacitance to the chip substrate, which is undesirable. In the present invention, the input bond-pad 20 is bootstrapped by extending the active shield 3 to a conductive area 21 (indicated by the dashed lines), which is patterned in a conductive layer, e.g., interconnect layer, below the input bond-pad and connected to the bond-pad by way of a via using conventional semiconductor fabrication techniques. Connections between the sensor input bond-pad 20 and the amplifier on chip are guarded by an internal active shield 14. Additionally, internal active shield 14 covers all other components that are integrated onto the chip 24, including the internal metal traces and transistors, which are described more fully below with reference to a preferred embodiment shown in FIG. 3. In an exemplary implementation, the internal active shield 14 may be formed in a polysilicon layer (e.g., Poly1 or Poly2) or in a metal layer (e.g., Metal1).

The chip may be encapsulated in a package 50, with connections to the package being formed by bond wires, bond bumps, or other methods as are known in the art. In an exemplary embodiment, the package may be a custom designed printed circuit board (PCB) that is connected to the active shield 14 by way of bond wires 17, 18 and 19, thereby extending the internal shield structures to the PCB level, bootstrapping the bond wires and shielding the integrated amplifier from external interference and parasitic capacitance.

To provide for high sensor input impedance, the output 102 of the sensing electrode 2 is connected to the gate 122 of an input transistor 22. The input transistor is configured within an amplifier topology that provides for a high input impedance such as, but not limited to, a source follower or a non-inverting operational amplifier. The parasitic device capacitance associated with the input transistor 22 (gate-to-source, gate-to-drain, gate-to-body) also must be eliminated. Power supply 16 provides a connection to an external voltage source, which is typically a battery.

By maintaining a constant current 15 through the source 120 and drain 123 of the input transistor 22, the gate-to-source capacitance is bootstrapped, forcing the source potential to track the potential at the gate. Although an offset between the gate 122 and source 120 is present due to the input transistor's threshold voltage, it has no impact on the efficacy of the bootstrap as the impedance between gate and source is substantially capacitive. The gate-to-body capacitance is simply bootstrapped by connecting the input transistor's body connection 121 to the source 120 which also has the benefit of eliminating the back-gate effect. The final device parasitic capacitance, gate-to-drain, can be reduced with a drain bootstrap amplifier 23 which both provides a DC path for the amplifier's supply current and dynamically tracks the potential at the input transistor gate 122. The drain bootstrap 23 may be a single transistor (e.g., cascode/source follower) or multi-transistor amplifier (e.g., operational amplifier) and may also include a DC offset between the sensor output 7 to ensure that the input transistor 22 is operating within a desired region of operation.

As shown in FIG. 2, the buffered output 7 is taken from the source 120 of the input transistor 22 since it provides a low-impedance replica of the signal at the sensor's input. This signal is used, with or without additional buffering, to drive the various active shields 3, 14. In the basic schematic diagram, taking the output signal from the source 120 introduces a DC offset, as previously discussed. The sensor output 7 may be taken from a point in the circuit that provides a buffered signal without a substantial offset (limited to device fabrication matching).

Input biasing and ESD protection is accomplished via on-chip structures 10, 11, which connect the sensor input (gate 122) to a reference potential 5 through a high impedance, low leakage path. The ESD/biasing diodes 10 and 11 are typically integrated diode-connected transistors which conduct minimally during normal operation to preserve the amplifier's high input impedance and to avoid adding noise. The ESD/biasing diode 10 is further bootstrapped to reduce the parasitic capacitances. In an exemplary embodiment, the bootstrapping signal for the bias/ESD diode 10 is AC coupled to avoid extra leakage across the bias/ESD diode 10 from DC offsets introduced by the amplifier. Alternatively, the bias/ESD diodes can be removed completely so that the input of the electric field sensor essentially operates as a floating gate. Electrical insulation of the sensor input ensures that the input transistor's gate is protected from ESD damage. The same methods used to program the floating gates of a non-volatile memory can be used to initialize the DC voltage of the sensor input to any desired level.

The semiconductor die 24 on which the integrated amplifier is fabricated may also support multiple sensor channels plus additional circuits to accomplish further amplification, signal processing, digitizing and/or wireless transmission of data.

Figure 3:
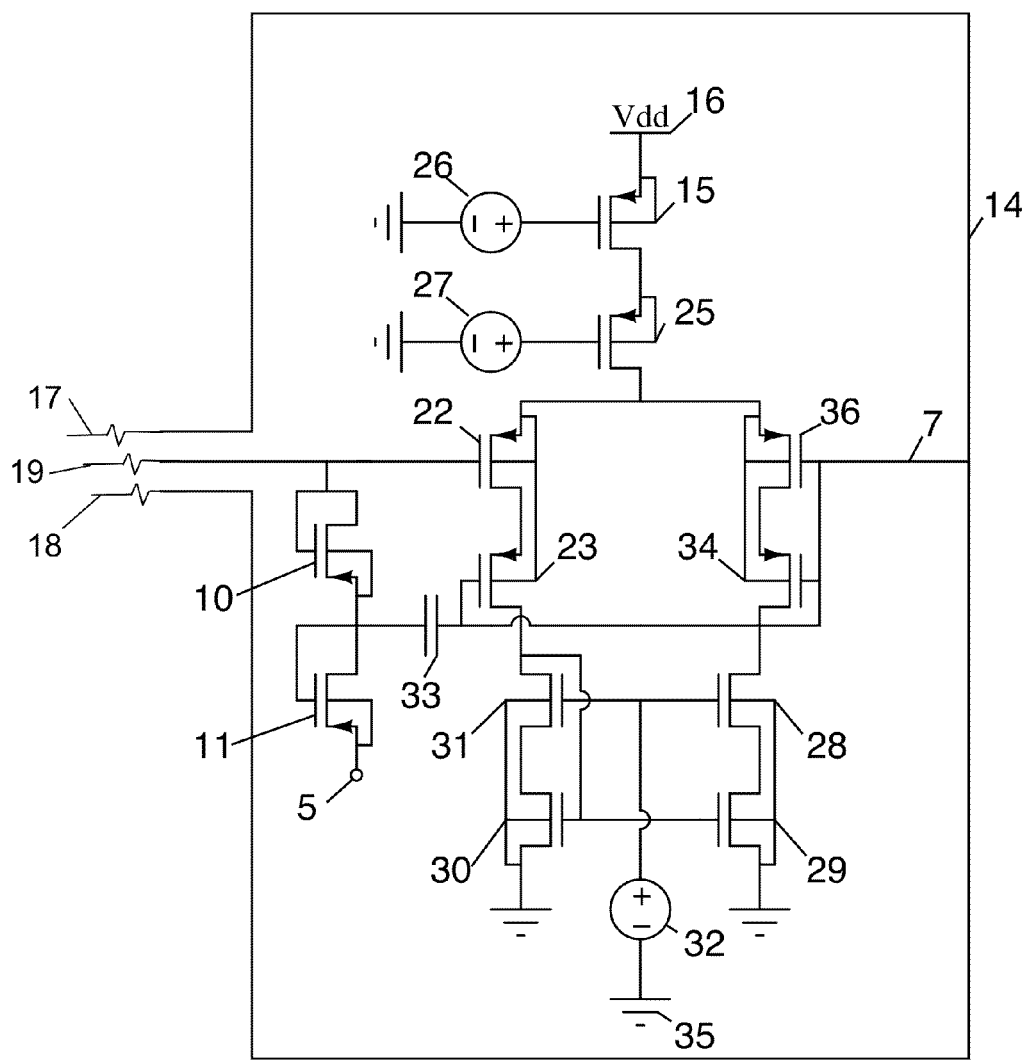
FIG. 3 is a circuit diagram of a preferred embodiment of the present invention.
Figure 4:
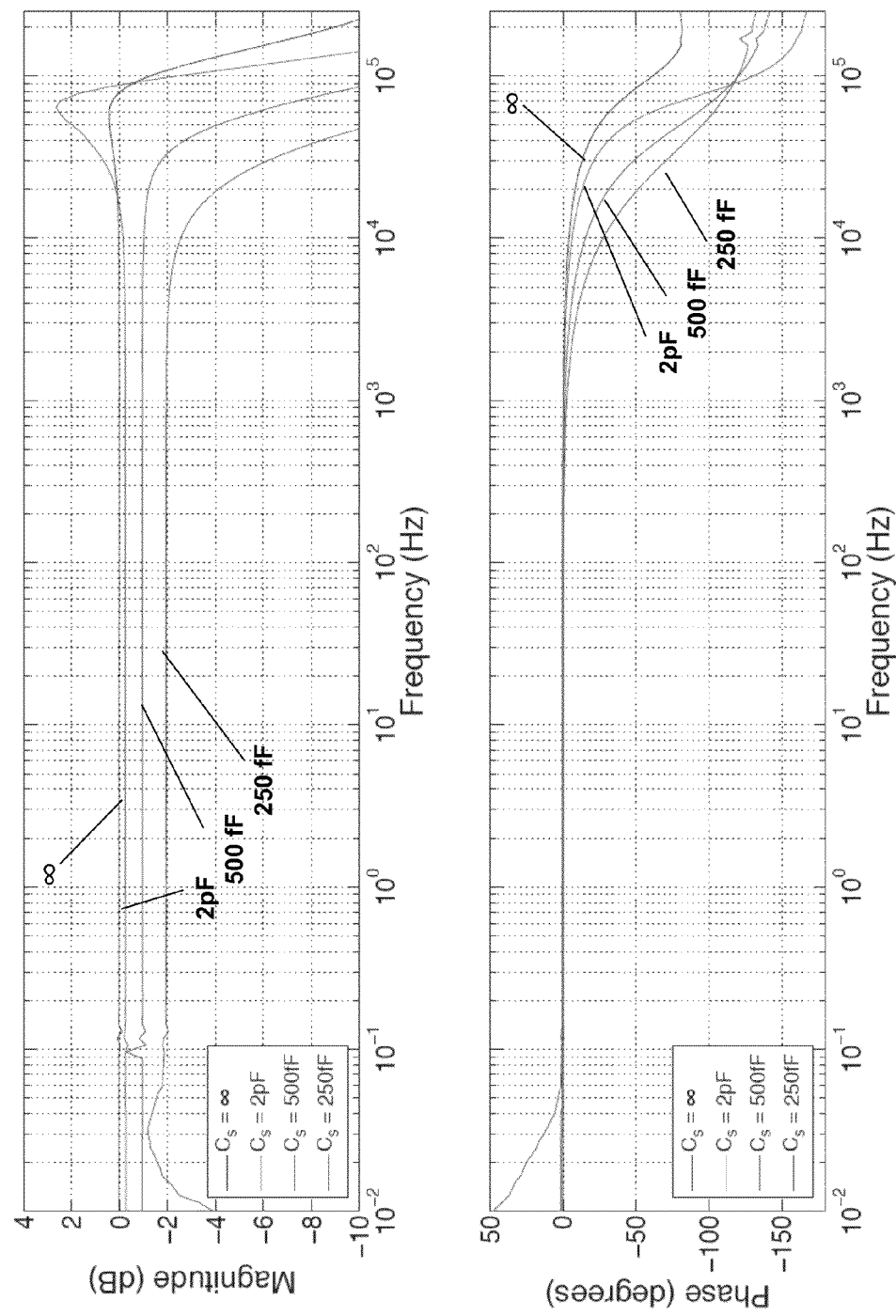
FIG. 4 is a graph showing the measured input capacitance of the preferred embodiment of the present invention.

The implementation for the integrated amplifier in the preferred embodiment is illustrated in FIG. 3. The preferred embodiment provides one possible method to design a high impedance input, integrated amplifier with the basic features described with reference to FIG. 2. Other possible embodiments are possible including different amplifier topologies, such as the source follower of FIG. 6, as well as amplifier configurations with gains of greater than unity. Referring to FIG. 3, the input transistor 22, of the preferred embodiment, is configured as part of an operational amplifier circuit in a unity gain configuration, as would be recognized by a person skilled in the art. The preferred embodiment consists of standard components which will be listed briefly as their function would be readily apparent to a person skilled in the art. The circuit components include a current source 15 with a cascode transistor 25, with appropriate biasing signals 26, 27. The input transistor has an additional transistor 36 to form the differential pair. Transistors 28, 29, 30, 31 form a cascoded current mirror circuit, with the cascode bias 32, which would recognized by a person skilled in the art as being a standard component in an operational amplifier. The output 7 is connected to the gate of transistor 36, which is the inverting input of the operational amplifier.

As described with reference to FIG. 2, a constant current is maintained through the input transistor through the use of the current source 15 and the negative feedback of the unity gain configuration, thus minimizing the gate-to-source and gate-to-body capacitances to the sensor input. To eliminate the gate-to-drain capacitance in the preferred embodiment, the drain bootstrap amplifier 23 is implemented by a transistor where the gate is connected to the operational amplifier's output and where the source is connected to the drain of the input transistor 22. Since the output of the operational amplifier follows the sensor input and the current through the input transistor 22 is constant, the current through the drain bootstrap amplifier 23 is constant. Thus, the drain bootstrap amplifier 23 forces drain potential of the input transistor 22 to dynamically follow the signal at the sensor input effectively bootstrapping the gate-to-drain capacitance. In the preferred embodiment, the bootstrap amplifier 23, a single transistor, is dimensioned such that the offset introduced between the gate and source of 23 is small enough to ensure that the input transistor 22 remains within the desired region of operation. To maintain a symmetrical circuit design, the same structure is implemented for the inverting input transistor 36 using the transistor 34 where the gate is likewise connected to the output signal. In an alternative embodiment, it is possible to remove transistor 34 or connect the gate of transistor 34 to a constant bias voltage such that the transistor 34 behaves as a normal cascode.

Still referring to FIG. 3, the sensor input, particularly the gate of the input transistor 22, is biased and protected with the ESD/biasing diodes 10, 11. Bootstrapping of the diode 10 is accomplished by coupling the amplifier's output 7 to the diode 10 via a blocking capacitor 33. The blocking capacitor ensures that the DC potential of the sensor input is set to the reference potential 5 while there is no AC potential difference across ESD/biasing diode 10, to minimize its parasitic capacitance and leakage to the input.

The preferred embodiment has a ground potential 35. The operational amplifier of the preferred embodiment is interfaced to the rest of the sensor through the input connection 19 and active shield connections 17, 18 in the same manner as described with reference to FIG. 2. The internal active shield 14 which is connected the guard connections 17, 18 is driven by the output of the amplifier 7. Additional buffering may be placed between the output of the amplifier 7 and any active shields without loss of generality and maintains the same benefits as claimed in the present invention.

Figure 5:
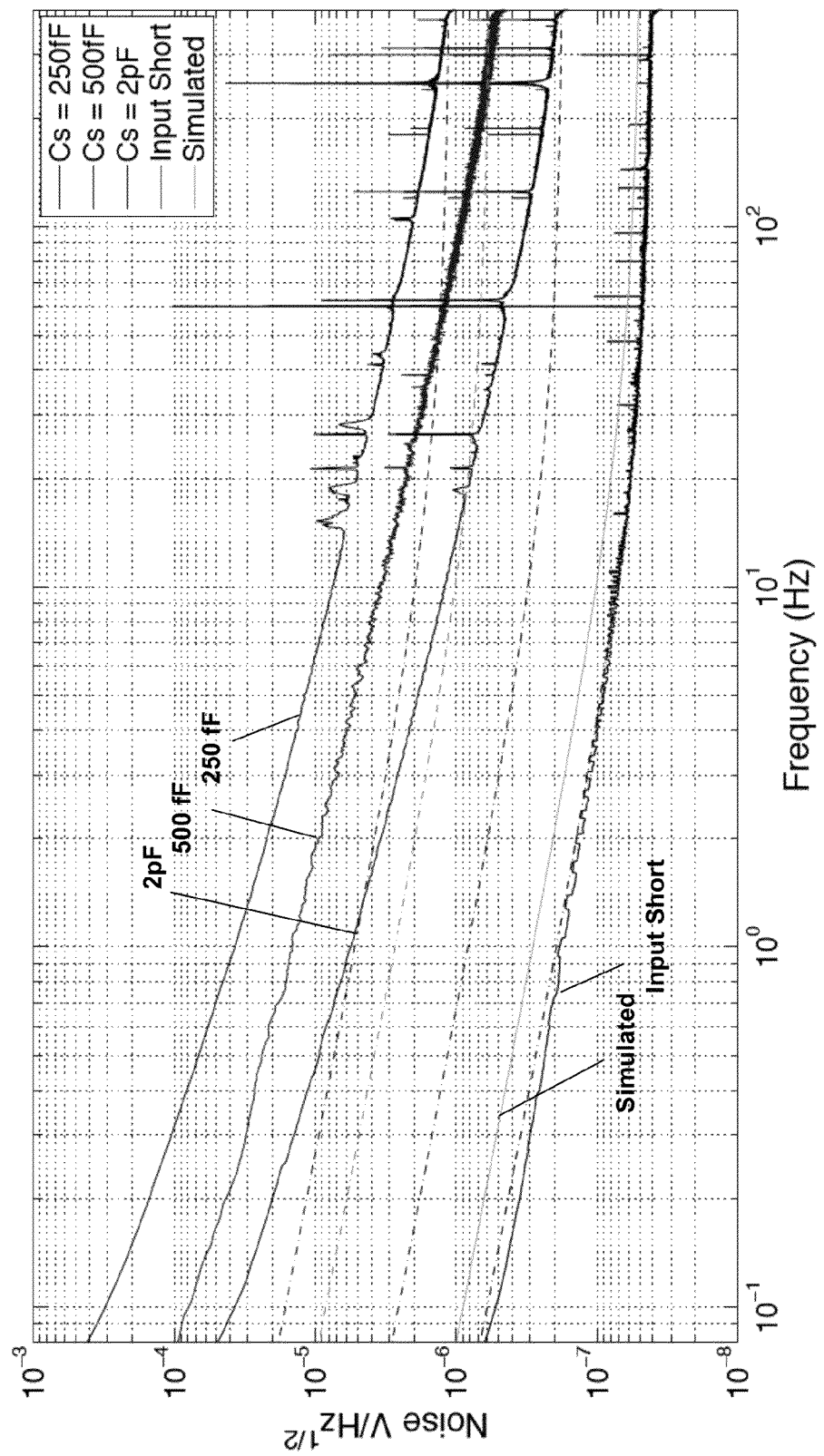
FIG. 5 is a graph showing the measured input-referred noise of the preferred embodiment of the present invention.

Measured specifications from the preferred embodiment are provided in Table 1. Compared to prior art discrete amplifier implementations using components such as the TI INA116 (Texas Instruments, Dallas, Tex.), the inventive integrated amplifier achieves a higher input impedance (50 TΩ||0.06 pF versus 1 TΩ||2 pF). Additionally, the present invention integrates the on-chip ESD/bias structure with lower current noise (0.05 fA/(Hz)$^{1/2}$ versus 0.1 fA/(Hz)$^{1/2}$). Finally, the present invention also utilizes a lower power supply (0.0015 mA at 3 V versus 2 mA at 9 V). Detailed measurements of the preferred embodiment's frequency response can be seen in FIG. 5. The preferred embodiment achieves minimal gain attenuation, as a result of the high input impedance, even with coupling capacitance as small as 0.25 pF. Noise measurements of the preferred embodiment at various coupling capacitances can also be found in FIG. 6. Measurements for the present invention included the semiconductor packaging parasitics and were accomplished without the need for manual calibration, tuning or neutralization.

TABLE 1

| Feature | Integrated Amplifier | TI INA116 |
| --- | --- | --- |
| Process | 0.5 μm 2P3M CMOS | TI BiFET |
| Input resistance | >50 TΩ | >1 TΩ |
| Input capacitance | 60 fF | 2 pF |
| Voltage noise at 1 kHz | 45 nV/(Hz)$^{1/2}$ | 28 nV/(Hz)$^{1/2}$ |
| Voltage noise at 1 Hz | 200 nV/(Hz)$^{1/2}$ | 1 μV/(Hz)$^{1/2}$ |
| Current noise at 1 Hz | 0.05 fA/(Hz)$^{1/2}$ | 0.13 fA/(Hz)$^{1/2}$ |
| Bandwidth (G = 0 dB) | 100 kHz | 800 kHz |
| Offset | 0.5 mV | 2 mV |
| Power Supply (1 channel) | 1.5 μA at 3.3 V | 2 mA at 9 V |

Figure 6:
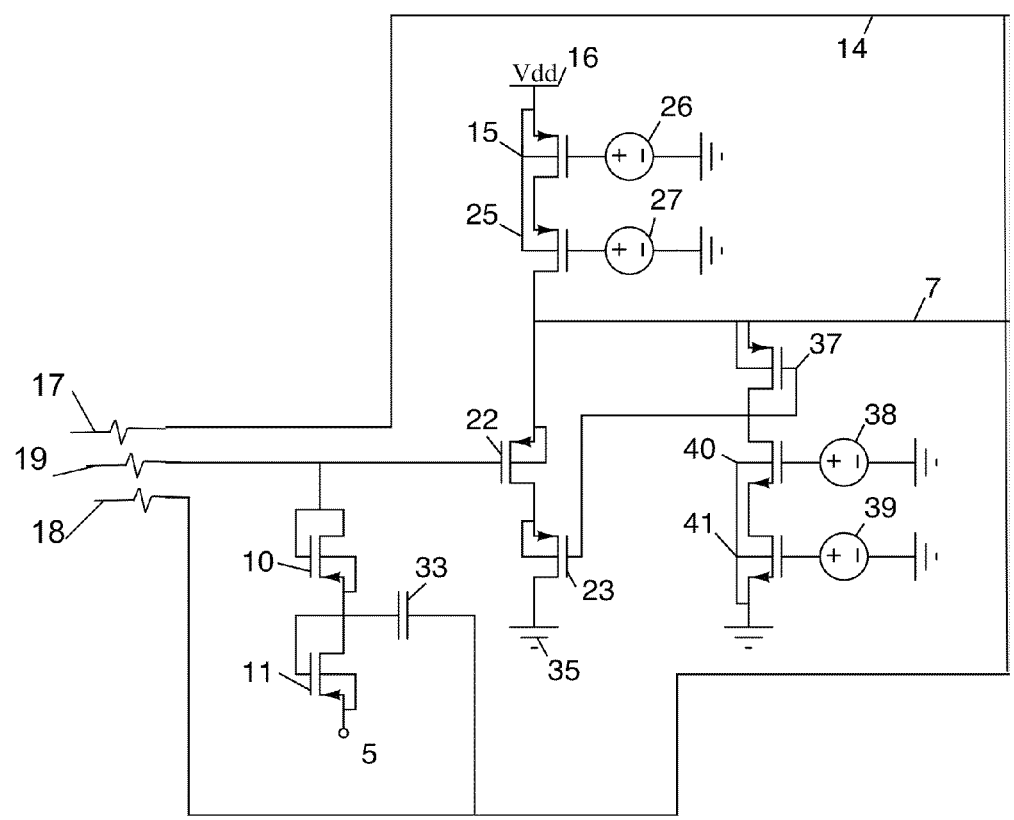
FIG. 6 is a circuit diagram of an alternative embodiment of the present invention.

FIG. 6 illustrates an alternative embodiment in which the integrated amplifier is a source follower rather than an operational amplifier. It likewise consists of the input transistor 22 which is biased with the current source formed by transistors 15, 25 and bias signals 26, 27, in the same manner as the preferred embodiment. In this embodiment, the output signal 7 is taken from the source of the input transistor 22, which dynamically tracks the sensor input with an offset dictated by the threshold voltage of input transistor 22, an effect well known in the art. Consequently, the output signal cannot be directly used to drive the bootstrap amplifier 23, which otherwise performs in the same manner as the preferred embodiment. To compensate for the offset, a means for DC-level shifting of the output signal is accomplished by passing the signal through a diode 37. The output signal, now with an offset to reverse the first offset introduced by the input transistor 22, can now be used to drive the drain bootstrap amplifier 23. For the diode 37 to introduce a constant DC offset, it is biased with a current source formed by transistors 40, 41 and bias voltages 38, 39. The current set by transistor 41 and bias voltage 39 is set an amount approximately ⅒ of the current set by transistor 15 and bias voltage 26 such that the bias current for the diode does not have a substantial effect on the amplifier. As known in the art, there exist a multitude of other circuits to accomplish the same effect of adding an offset, and the use of a diode and current source in this embodiment is only one such approach. The remainder of the circuit including the ESD/bias diode network consisting of diodes 10, 11 and capacitor 33 functions in the same manner as the embodiment of FIG. 3. This embodiment is likewise connected with connections 17, 18, 19 and guarded with active shield 14 in a similar fashion as the preferred embodiment.

Figure 7:
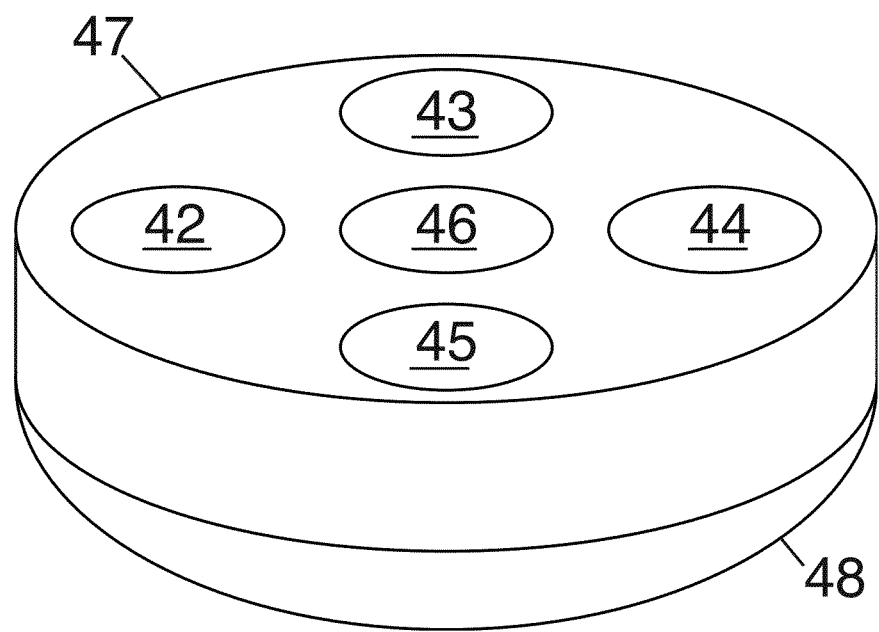
FIG. 7 is a diagrammatic perspective view of an exemplary sensor housing for local spatial electric field measurement.

Multiple sensors according to the present invention may be combined to enable measurement of local spatial electric fields. One possible embodiment of an electric field sensor is illustrated in FIG. 7. The multiple sensors may be connected to a central signal processing and data acquisition unit (not shown). In this embodiment, multiple sensing electrodes 42, 43, 44, 45 may be placed on a single sensor body 47. In an exemplary embodiment, the sensor body 47 may be one or more printed circuit boards (PCBs) on which the packaged IC with the integrated amplifier(s) is mounted on one side and the sensing electrodes are formed on the opposite side. Each of the sensing electrodes may be formed from a solid copper fill. An integrated amplifier and active shield is necessary for each of the sensing electrodes and may be fabricated on a single chip die or multiple chip dies may be combined within a single or multiple packages which are physically retained on or within the sensor body 47. Any circuitry, including the integrated amplifiers according to the present invention, may be conveniently placed on the face opposite of the sensing electrodes on the sensor body 47 along with any other necessary signal processing and acquisition circuitry to enable to storage or transmission of data. Additionally, the integrated circuit die may be encapsulated within an active shield 48 to prevent external interference. The arrangement of sensing electrodes enables the acquisition of electric fields by measuring the voltage difference registered by each electrode. In the embodiment shown in FIG. 7, the sensing electrodes are arranged in two orthogonal pairs to measure a 2-D local spatial electric field, although other geometric arrangements are possible. An additional ground reference electrode 46 may also be placed on the sensor body 47. As is known in the art, the ground electrode can be driven with a signal derived by summing and inverting any combination of signals obtained from the sensing electrodes, rather than a simple passive ground reference, to achieve higher common-mode rejection. Finally, the present invention, which provides for a high sensor input impedance using the integrated amplifier, also is fully applicable to the conventional configuration of one electrode per substrate unit.

Figure 8:
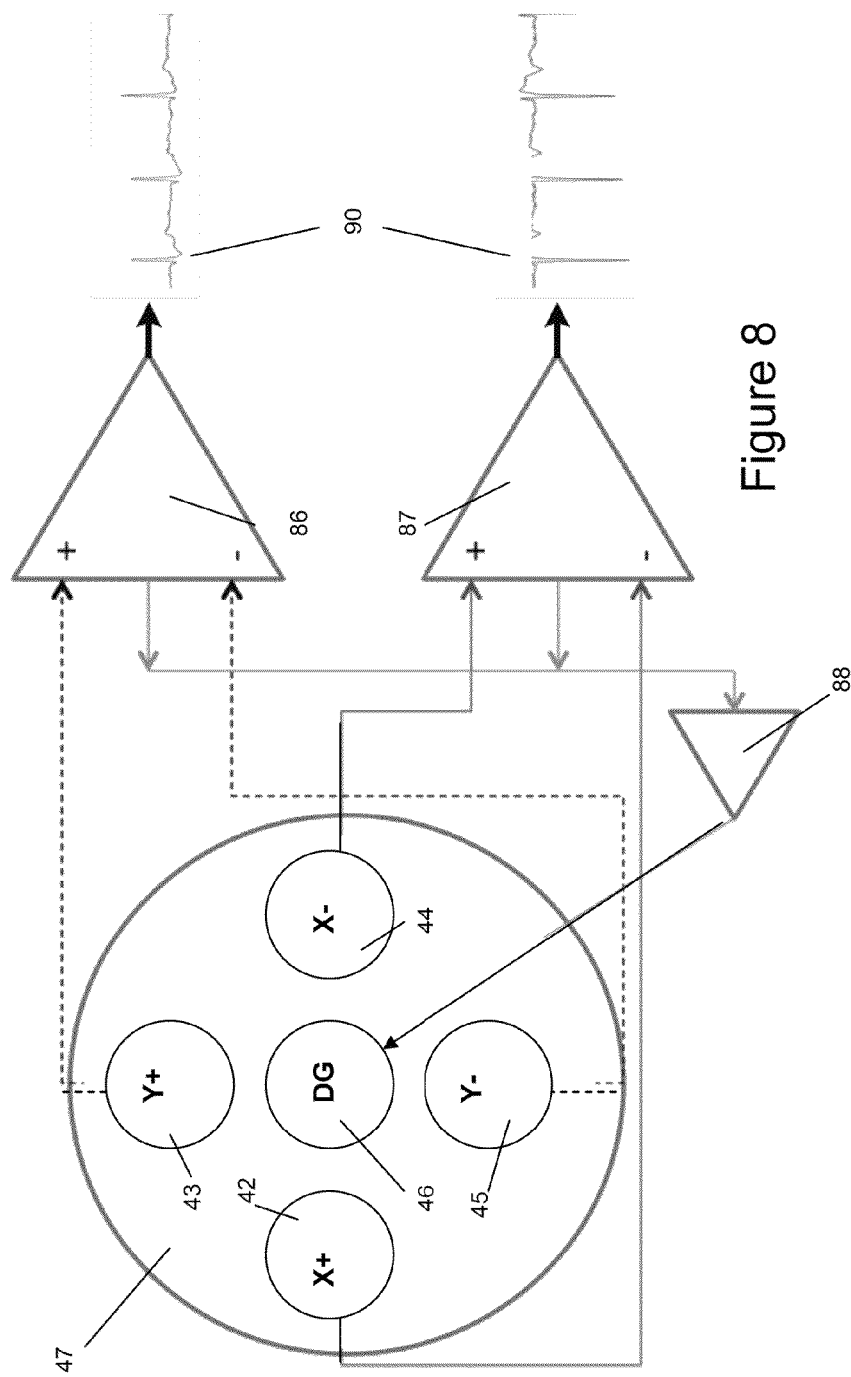
FIG. 8 is a block diagram of the exemplary sensor of FIG. 7.

As illustrated in FIG. 8, sensing electrodes 42 and 44 sense the horizontal gradients for input into differential amplifier 87, while electrodes 43 and 45 sense the vertical gradients for input into differential amplifier 86. As described above, the outputs of the differential amplifiers 86, 87 may be input into inverting amplifier 88, which constructs the average of components 42, 44, 43 and 45 in order to suppress the common-mode signal by applying feedback through the driven ground 89. Differential amplifiers 86, 87 produce separate gradient signal outputs 90 corresponding to the two dimensions, e.g., horizontal and vertical, thus allowing for measurement of 2-D local spatial electric fields.

As will be apparent to those of skill in the art, the exemplary orthogonal arrangement of electrodes described above is only one of many possible geometrical arrangements that may be used for local electric field measurement. In one alternative embodiment, three electrodes may be arranged in a triangular layout with one of the inputs to each differential amplifier being taken from a shared active electrode. In fact, three separate signal outputs may be generated by defining each side of the triangle as a pair of electrodes, i.e., a potential difference is measured across each edge that connects pairs of vertices in a graph, in which the electrodes are the vertices. In general, the electrodes may be arranged in polygons, concentric circles, crosses, ellipses, stars or any other geometrical layout in which different permutations of electrode pair combinations provide inputs to different differential amplifiers to measure the potential difference between different points within the area of interest.

Typical dimensions for the sensor body 47 are on the order of 20 to 25 mm or smaller (smaller than a U.S. quarter). No external connections to other electrodes, a ground or a base unit are required. All the circuitry and the power supply (in the form of a battery) can be located on the sensor body, either as part of the integrated circuitry as an element that is external to the IC. In addition, with the additional of transceiver circuitry, data may be transmitted wirelessly for a truly encapsulated device.

The following examples describe implementations of the inventive sensor and applications thereof to physiological measurement.

Example 1

Data Acquisition System and ECG Measurement

A wireless bioinstrumentation platform capable of supporting various electrodes was designed around the TEXAS INSTRUMENTS TI ADS1298, which provides an array of eight 24-bit A/D converters. The high resolution of the ADS1298 allows for the use of minimal voltage gain (0 dB-6 dB) and a fully DC-coupled signal path, which makes the system immune to DC offset errors and long overload recovery times from high-pass filters. The device provides connectors and power to support up to four active electrodes. An additional four passive electrodes can also be included.

A PIC24 microcontroller (Microchip Technology, Inc., Chandler, Ariz.) is used to interface the ADS1298 with the BLUETOOTH® module. Data is streamed to a PC or other appropriate processing system from the device at a rate of 500 sps via a standard BLUETOOTH® serial port interface. The fully wireless device minimizes the influence of power line interference to ensure low noise recordings. The entire system is power using two AAA batteries, which provide for approximately ten hours of continuous use. As will be readily apparent, other types of batteries may be used to extend operational time and/or reduce the overall size of the device.

Figure 9:
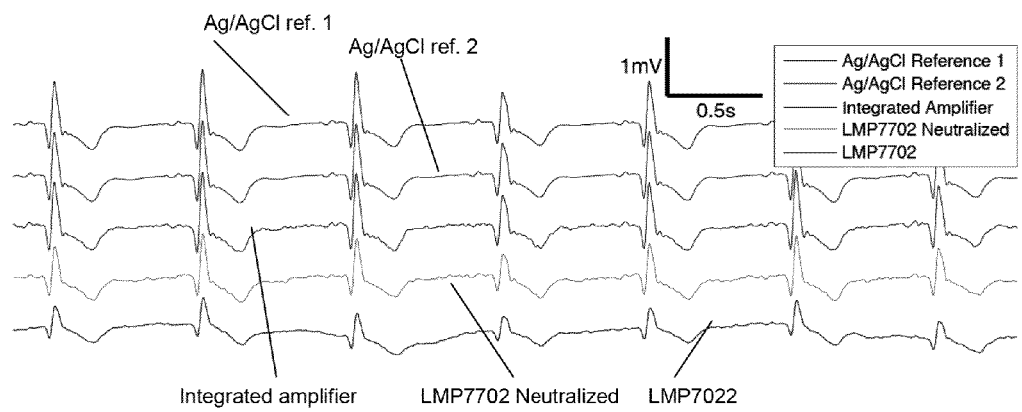
FIG. 9 shows a segment of ECG signals acquired simultaneously from five different electrodes placed on a test subject.

To quantify the performance of the non-contact sensor under a realistic environment, a simple protocol was devised to simultaneously compare live ECG signals from multiple sensor types. Two standard Ag/AgCl electrodes (control group), an integrated amplifier sensor, a discrete sensor (using with a LMP7702 (from National Semiconductor) interface) with input capacitance neutralization, and an identical discrete sensor with the neutralization network removed were all placed on the subject's forearm. Each of the electrodes was referenced against a single Ag/AgCl chest electrode, producing 5 output signals. Since the ECG potential is constant on the limb (verified via the two Ag/AgCl control electrodes), any discrepancy between the five output signals is the result of noise and distortion. A sample of the raw signal from each of the five electrodes tested is shown in FIG. 9.

| Sensor | r | b |
|---|---|---|
| Ag/AgCl-Ag/AgCl | .992 | .999 |
| Ag/AgCl - integrated amplifier | .953 | .996 |
| Ag/AgCl - LMP7702 (neutralized) | .918 | .865 |
| Ag/AgCl-LMP7702 | .715 | .541 |

Table 2 shows the correlation coefficient, r, of the ECG signal between the different sensors versus the reference Ag/AgCl electrode. The data analyzed was taken over a 2.5 minute period and bandpass filtered between 0.0 fHz and 35 Hz. The integrated amplifier shows significantly improved correlation compared to the discrete implementation. Similarly, Table 2 also shows the computed linear regression coefficient, b, between the various sensors and the Ag/AgCl reference to illustrate the gain error due to the effects of source-input impedance division. The integrated amplifier of the present invention manages to maintain a high degree of gain accuracy even through the high source impedance of the cotton sweater that the subject was wearing, and is significantly superior to both the neutralized and unadjusted discrete sensors.

Figure 10:
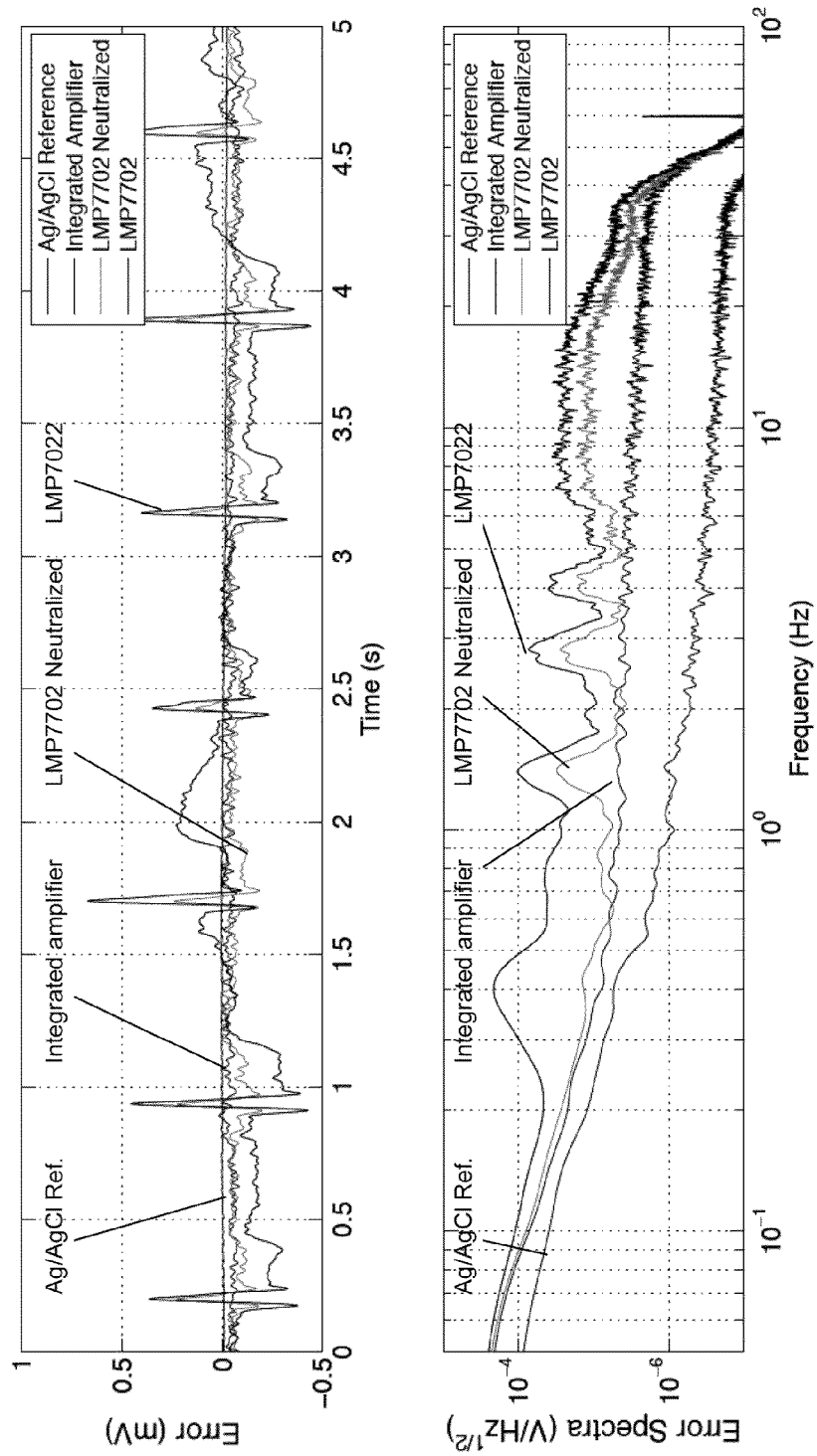
FIG. 10 shows the residual error of the signals acquired by the different sensor relative to the reference Ag/AgCl electrode.

FIG. 10 provides plots of both a raw sample of the error, defined as the difference between each of the electrodes, and the Ag/AgCl reference, as well as its power spectra over the entire 2.5 minute period. As shown, the difference between the two Ag/AgCl electrodes is negligible. The integrated amplifier has a significantly increase noise floor, in large part due to the noise from the cotton interface, but is nonetheless broadband in nature. Significant CMRR errors are visible in both discrete implementations as a result of their relatively large input capacitance. The integrated amplifier of the present invention, while noisier, represents a fundamentally more faithful reproduction of the signal due to its low input capacitance.

Example 2

EEG Signal Validation

The same sensor used in Example 1 was used to validate its application to EEG BCI (brain-computer interface) and monitoring. A simple alpha wave experiment was used. Spectrograms of EEG data were taken during a trial where a subject was asked to close their eyes from the segment spanning 5 to 20 seconds into the trial. The integrated sensor was able to resolve alpha waves through hair over the occipital region. The presence and absence of alpha activity was confirmed by an Ag/AgCl control electrode placed on the forehead.

Steady-state visual evoked potential experiments are effective at verifying the performance of EEG sensor systems since it relies on detecting known and controlled narrowband stimuli. In addition, it also serves as a common BCI paradigm. For the experiment, the integrated amplifier electrode was mounted in a relatively loose-fitting headband over the occipital region. A second Ag/AgCl electrode was placed on the forehead and used as a reference. The subject was presented with a 4 by 3 grid of SSVP stimuli boxes delivered on a computer screen. Each box flashed a different frequency ranging from 9 to 12 Hz. The subject was instructed to sequentially focus on each box on the grid. In effect, this performs a SSVP "tone sweep" stimulus, which should be readily visible in the EEG spectra.

The resulting spectrogram showed that the integrated amplifier is fully able to resolve the SSVP signal to at least 0.25 Hz, even through hair. This degree of signal quality has yet to be demonstrated with other reported non-contact EEG sensor systems.

Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter, which is broadly contemplated by the present invention. It is further understood that the scope of the present invention fully encompasses other embodiments that may become obvious to those skilled in the art.

The invention claimed is:

1. An electric field sensor, comprising:
   at least one sensing electrode for detecting an electric field and generating an input signal;
   a sensor input connected to the at least one sensing electrode for receiving the input signal;
   an integrated amplifier adapted to generate at least one buffered output signal that replicates the input signal, the integrated amplifier comprising a substrate, a package assembly and a plurality of circuit elements integrated on the substrate and enclosed within the package assembly, each circuit element comprising a plurality of terminals, wherein a first portion of the plurality of terminals is connected to the sensor input;
   an active shield in electrical communication with an output of the integrated amplifier so that the at least one buffered output signal drives the active shield; and
   wherein the first portion of the plurality of terminals is shielded from the substrate and the package assembly by a second portion of the plurality of terminals substantially following one of the input signal and the buffered output signal.

2. The sensor of claim 1, wherein at least one of the circuit elements connected to the sensor input comprises a bonding connection between a chip bond-pad disposed on the substrate and one or more circuit components external to the substrate, and wherein said bonding connection is guarded with the active shield.

3. The sensor of claim 1, wherein the package assembly comprises a conductive portion in electrical communication with the active shield, thereby bootstrapping and shielding the integrated amplifier from external interference and parasitic capacitance.

4. The sensor of claim 1, wherein at least one of the circuit elements connected to the sensor input comprises an external connection between the sensor electrode and the integrated amplifier, and wherein the external connection is bootstrapped by the active shield.

5. The sensor of claim 1, wherein at least one of the circuit elements comprises a field effect transistor having a gate, a drain, a source and a body terminal, and wherein the gate is connected to the sensor input and the source and the body terminals are connected together.

6. The sensor of claim 5, wherein a current between the source and the drain of the field effect transistor is maintained at a constant level so that a potential between the gate and the source and the body terminal is substantially constant, whereby the source and the body terminal are bootstrapped.

7. The sensor of claim 5, wherein the drain of the field effect transistor is connected to a drain bootstrap amplifier that replicates the signal from the active shield to bootstrap the drain.

8. The sensor of claim 5, wherein at least one of the plurality of circuit elements connected to the sensor input comprises an internal connection connected to the gate of the field effect transistor and wherein the internal connection is bootstrapped by the active shield.

9. The sensor of claim 8, wherein the internal connection links the gate of the field effect transistor to a chip bond-pad disposed on the substrate and wherein the chip bond-pad is guarded with the active shield to reduce a parasitic capacitance of the chip bond-pad.

10. The sensor of claim 5, wherein at least one of the circuit elements connected to the sensor input comprises of a floating gate without conductive connections to the gate of the field effect transistor to sustainably eliminate a leakage current at the sensor input.

11. The sensor of claim 10, wherein the floating gate is programmed via a non-volatile charge writing mechanism.

12. The sensor of claim 1, wherein at least one of the circuit elements connected to the sensor input comprises an electrostatic discharge (ESD) and biasing structure connected to the sensor input.

13. The sensor of claim 12, wherein the ESD and biasing structure comprise at least one diode, wherein the diode is bootstrapped by driving the diode with the active shield to maintain a potential difference of zero between the diode and the sensor input.

14. The sensor of claim 1, wherein the at least one sensor electrode comprises multiple electrodes, and further comprising:
   a sensor body having a first surface and a second surface, wherein the multiple electrodes are disposed on the first surface and the sensor input, integrated amplifier and active shield are disposed on the second surface; and
   wherein the multiple electrodes comprise a combination of electrodes defining at least two pairs of active electrode signal sources and a reference electrode;
   a differential amplifier connected to each pair of active electrode signal sources for generating an output comprising a potential difference across the connected pair of active electrode signal sources; and
   wherein the potential difference across each pair of active electrode signal sources is used to determine a local spatial electric field.

15. The sensor of claim 14, further comprising an inverter having an output connected to the reference electrode, wherein the reference electrode is actively driven with a signal obtained by inverting a combination of potentials registered by the electrodes.

16. The sensor of claim 14, wherein an active electrode signal source comprises one active electrode that provides a shared input to each of at least two differential amplifiers, so that two or more pairs of active electrodes include the one active electrode.

17. The sensor of claim 14, wherein the combination of electrodes comprises at least two pairs of active electrodes, wherein each pair of active electrodes is connected to a corresponding differential amplifier.

18. The sensor of claim 17, wherein the at least two pairs of active electrodes are arranged in an orthogonal relationship.

19. An electric field sensor, comprising:
at least one sensing electrode for detecting an electric field and generating an input signal;
a sensor input connected to the at least one sensing electrode for receiving the input signal;
an integrated amplifier adapted to generate at least one buffered output signal that replicates the input signal, the integrated amplifier comprising a substrate, a package assembly and a plurality of circuit elements integrated on the substrate and enclosed within the package assembly, each circuit element comprising a plurality of terminals, wherein a first portion of the plurality of terminals is connected to the sensor input, the integrated amplifier further comprising an input transistor having a gate, a drain, a source and a body terminal, and wherein the gate is connected to the sensor input and the source and the body terminals are connected together;
an active shield in electrical communication with an output of the integrated amplifier so that the at least one buffered output signal drives the active shield;
wherein the first portion of the plurality of terminals is shielded from the substrate and the package assembly by a second portion of the plurality of terminals substantially following one of the input signal and the buffered output signal.

20. The sensor of claim 19, wherein a current between the source and the drain of the input transistor is maintained at a constant level so that a potential between the gate and the source and the body terminal is substantially constant, whereby the source and the body terminal are bootstrapped.

21. The sensor of claim 19, wherein the drain of the field effect transistor is connected to a drain bootstrap amplifier that replicates the signal from the active shield to bootstrap the drain.

22. The sensor of claim 19, wherein at least one of the plurality of circuit elements connected to the sensor input comprises an internal connection connected to the gate of the input transistor and wherein the internal connection is bootstrapped by the active shield.

23. The sensor of claim 19, wherein the internal connection links the gate of the input transistor to a chip bond-pad on the semiconductor substrate and wherein the chip bond-pad is guarded with the active shield to reduce a parasitic capacitance of the chip bond-pad.

24. The sensor of claim 19, wherein at least one of the circuit elements connected to the sensor input comprises a bonding connection between a chip bond-pad on the substrate and one or more circuit components external to the integrated amplifier, and wherein said bonding connection is guarded with the active shield.

25. The sensor of claim 19, wherein the the package comprises a conductive portion that is connected to the active shield, thereby bootstrapping and shielding the integrated amplifier from external interference and parasitic capacitance.

26. The sensor of claim 19, wherein at least one of the circuit elements connected to the sensor input comprises an external connection between the sensor electrode and the integrated amplifier, and wherein the external connection is bootstrapped by the active shield.

27. The sensor of claim 19, wherein at least one of the circuit elements connected to the sensor input comprises a floating gate without conductive connections to the gate of the input transistor to sustainably eliminate a leakage current at the sensor input.

28. The sensor of claim 19, wherein at least one of the circuit elements connected to the sensor input comprises an electrostatic discharge (ESD) and biasing structure connected to the sensor input.

29. The sensor of claim 28, wherein the ESD and biasing structure comprise at least one diode, wherein the diode is bootstrapped by driving the diode with the active shield to maintain a potential difference of zero between the diode and the sensor input.

30. The sensor of claim 19, wherein the at least one sensor electrode comprises multiple electrodes, and further comprising:
a sensor body having a first surface and a second surface, wherein the multiple electrodes are disposed on the first surface and the sensor input, integrated amplifier and active shield are disposed on the second surface; and
wherein the multiple electrodes comprise at least two pairs of active electrodes and a reference electrode;
a differential amplifier connected to each pair of active electrodes for generating an output comprising a potential difference across the connected pair of active electrodes; and
wherein the potential difference across each pair of active electrodes is used to determine a local spatial electric field.

31. The sensor of claim 30, wherein an active electrode signal source comprises a shared active electrode that provides a shared input to each of at least two differential amplifiers, so that two or more pairs of active electrodes include the shared active electrode.

32. The sensor of claim 30, further comprising an inverter having an output connected to the reference electrode, wherein the reference electrode is actively driven with a signal obtained by inverting a combination of potentials registered by the electrodes.

33. The sensor of claim 30, wherein the combination of electrodes comprises at least two pairs of active electrodes, wherein each pair of active electrodes is connected to a corresponding differential amplifier.

34. The sensor of claim 33, wherein the at least two pairs of active electrodes are arranged in an orthogonal relationship.

* * * * *